United States Patent [19]
Sato et al.

[11] Patent Number: 5,612,962
[45] Date of Patent: Mar. 18, 1997

[54] PIN-SCAN-IN TYPE LSI LOGIC CIRCUIT, PIN-SCAN-IN SYSTEM DRIVING CIRCUIT, AND METHOD OF TESTING CIRCUIT-MOUNTING SUBSTRATES

[75] Inventors: Toshiro Sato; Kunitoshi Yamamoto; Hiroyuki Adachi, all of Kawasaki, Japan

[73] Assignee: Fujitsu Limited, Kanagawa, Japan

[21] Appl. No.: 70,412

[22] PCT Filed: Oct. 5, 1992

[86] PCT No.: PCT/JP92/01289

§ 371 Date: Jun. 4, 1993

§ 102(e) Date: Jun. 4, 1993

[87] PCT Pub. No.: WO93/07502

PCT Pub. Date: Apr. 15, 1993

[30] Foreign Application Priority Data

Oct. 4, 1991 [JP] Japan .................................. 3-257646
Nov. 28, 1991 [JP] Japan .................................. 3-314538

[51] Int. Cl.⁶ ............................................. G01R 31/28
[52] U.S. Cl. ................................. 371/22.3; 371/22.1
[58] Field of Search ................................. 371/22.1, 22.3, 371/22.6, 15.1, 22.5, 23, 27, 29.1

[56] References Cited

U.S. PATENT DOCUMENTS

| | | | |
|---|---|---|---|
| 4,972,144 | 11/1990 | Lyon et al. | 371/22.6 X |
| 5,056,093 | 10/1991 | Whetsel | 371/22.3 |
| 5,101,153 | 3/1992 | Morong, III | 371/22.1 |
| 5,303,246 | 4/1994 | Anderson et al. | 371/22.3 |

FOREIGN PATENT DOCUMENTS

| | | |
|---|---|---|
| 1-109273 | 4/1989 | Japan . |
| 2-210281 | 8/1990 | Japan . |
| 1-11437 | 2/1991 | Japan . |

*Primary Examiner*—Ellis B. Ramirez
*Assistant Examiner*—Edward Pipala

[57] ABSTRACT

A pin-scan-in system driving circuit drives a pin-scan-in circuit to test short-circuit of the wirings or breaking of the wirings in the circuit-mounting substrate, and this circuit is driven using a reduced number of gates. The pin-scan-in system driving circuit drives the pin-scan-in circuit provided in an LSI logic circuit, and the LSI logic circuit is provided with a pin-scan-in circuit selector which selects the pin-scan-in circuit and a selected condition-holding circuit which holds the condition selected by the pin-scan-in circuit selector.

5 Claims, 15 Drawing Sheets

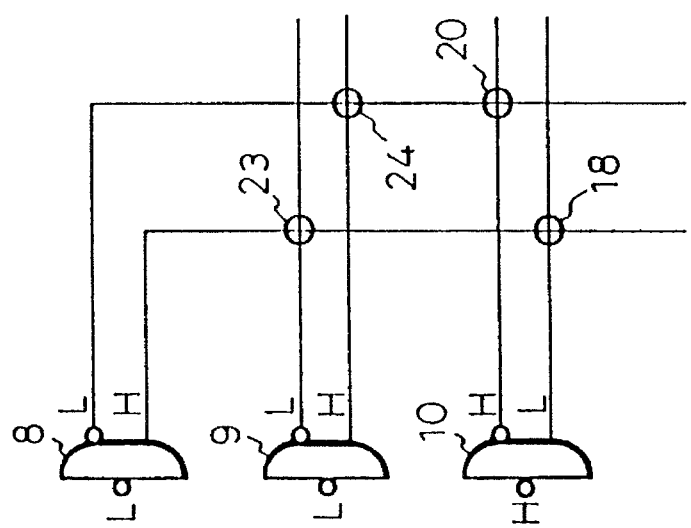
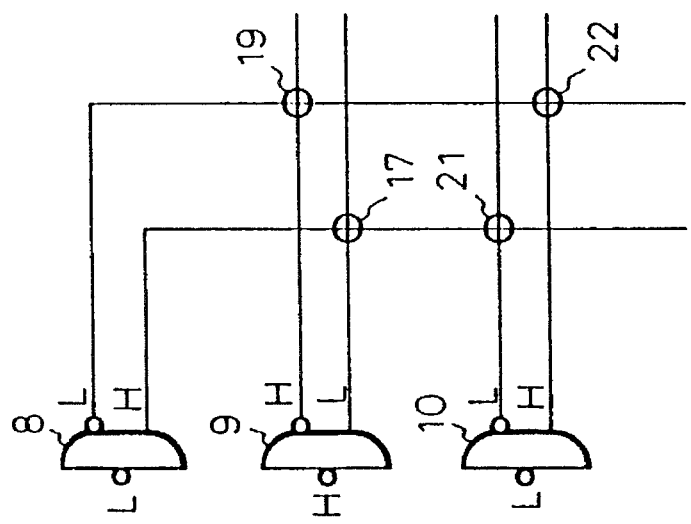
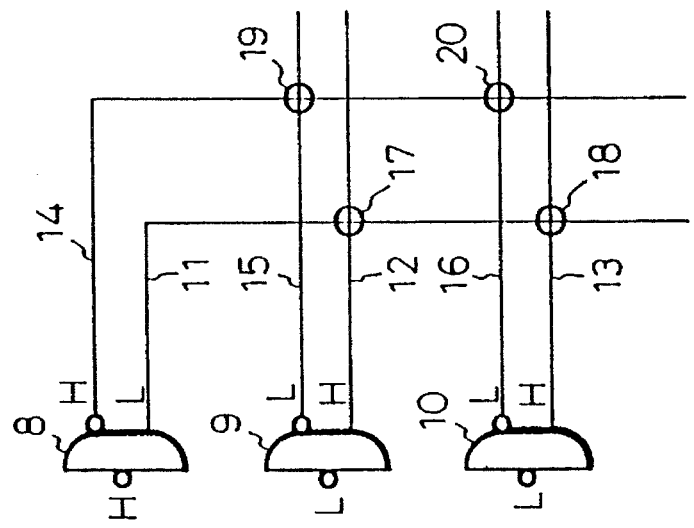

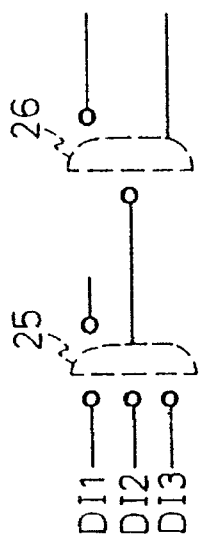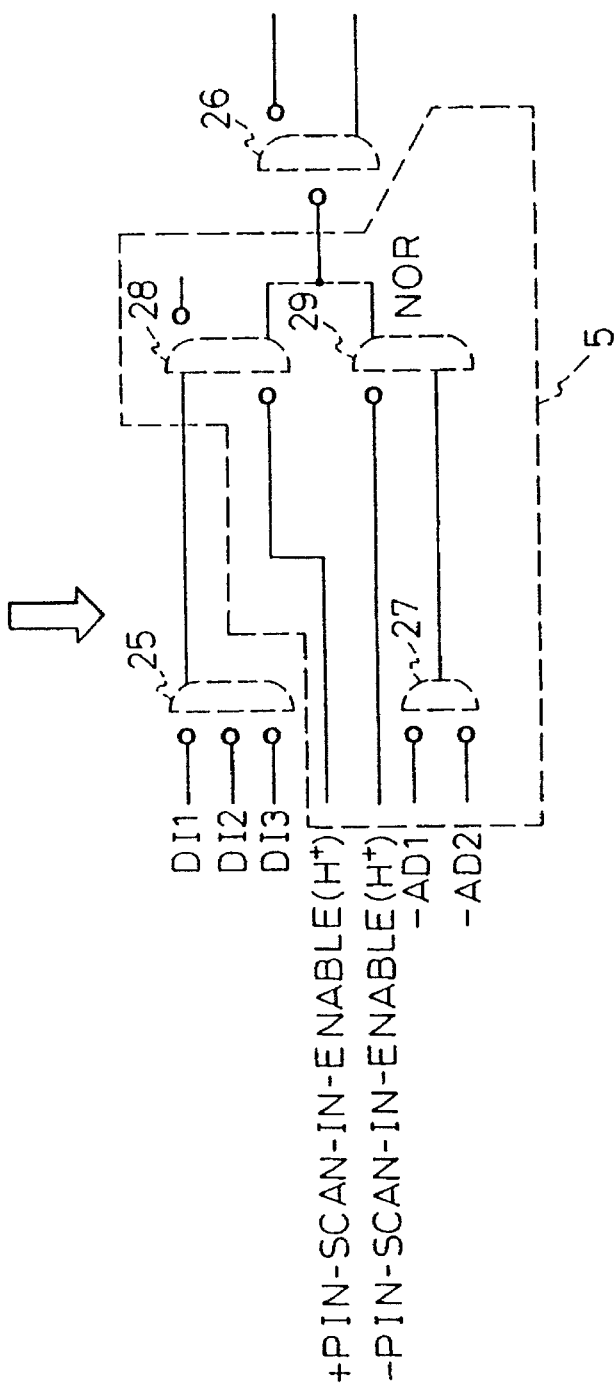
Fig.3(a)
Fig.3(b)

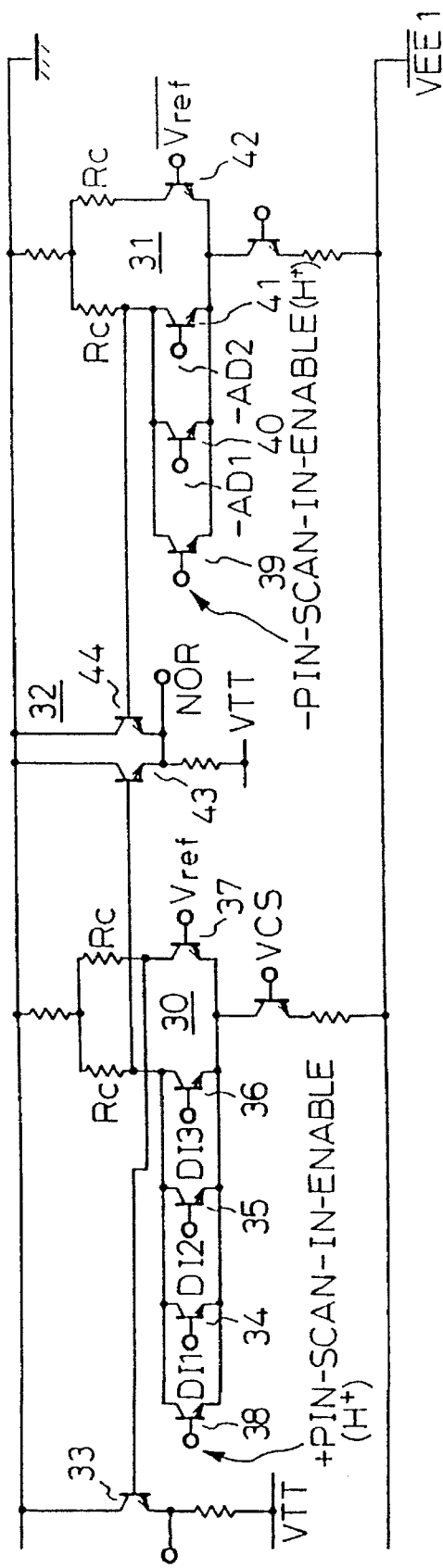

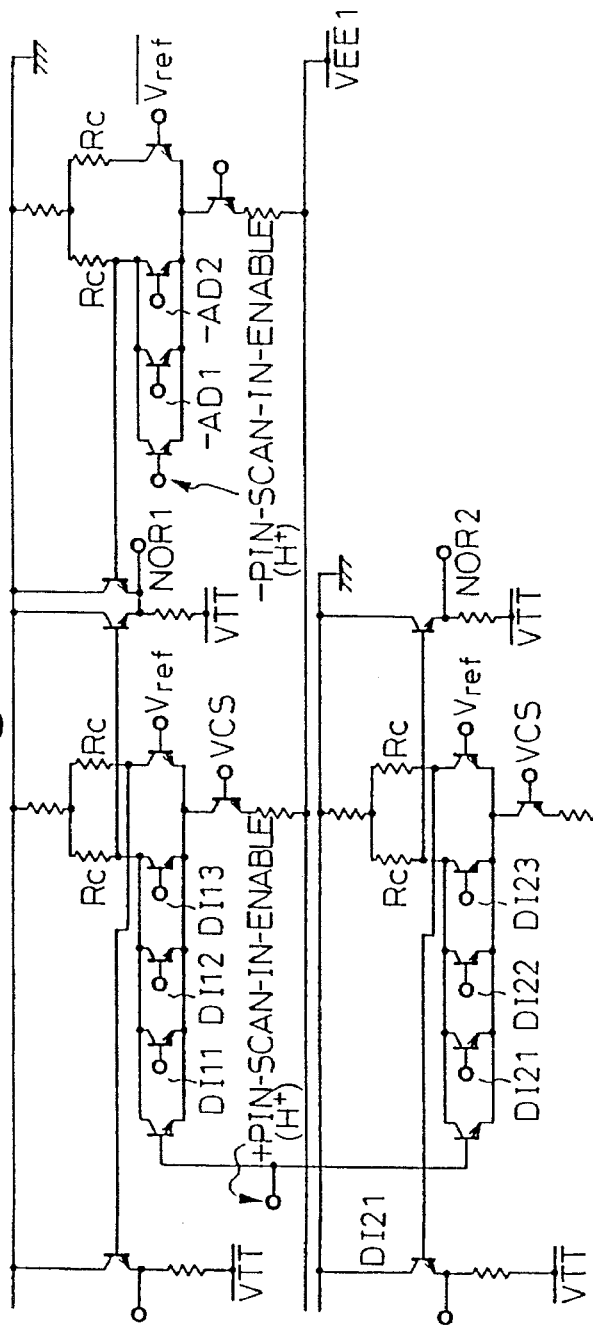

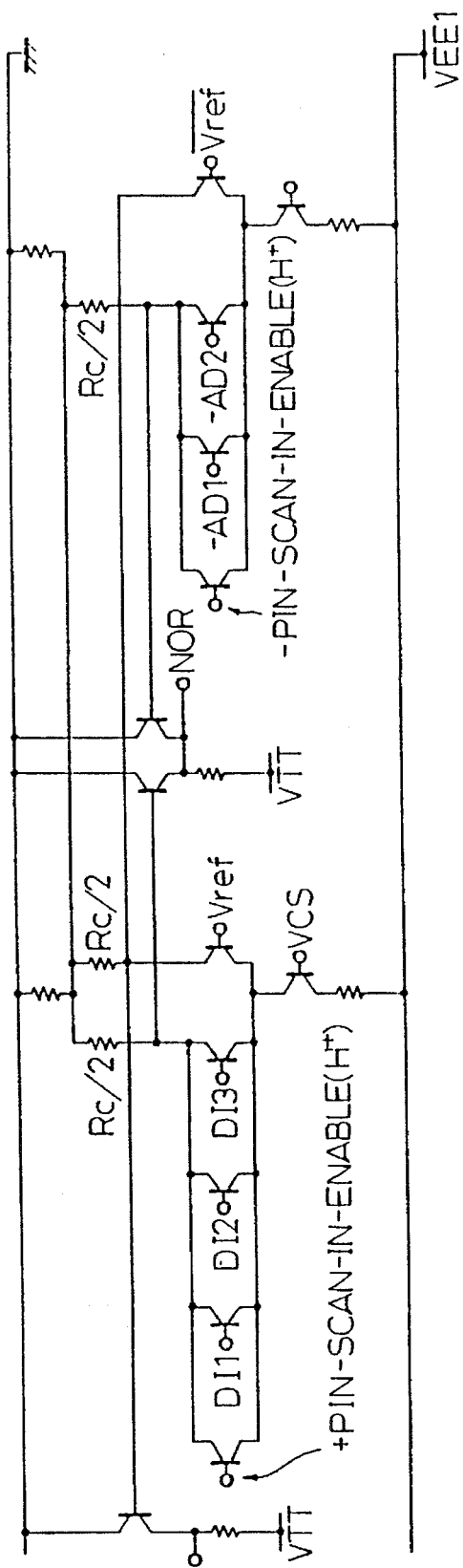

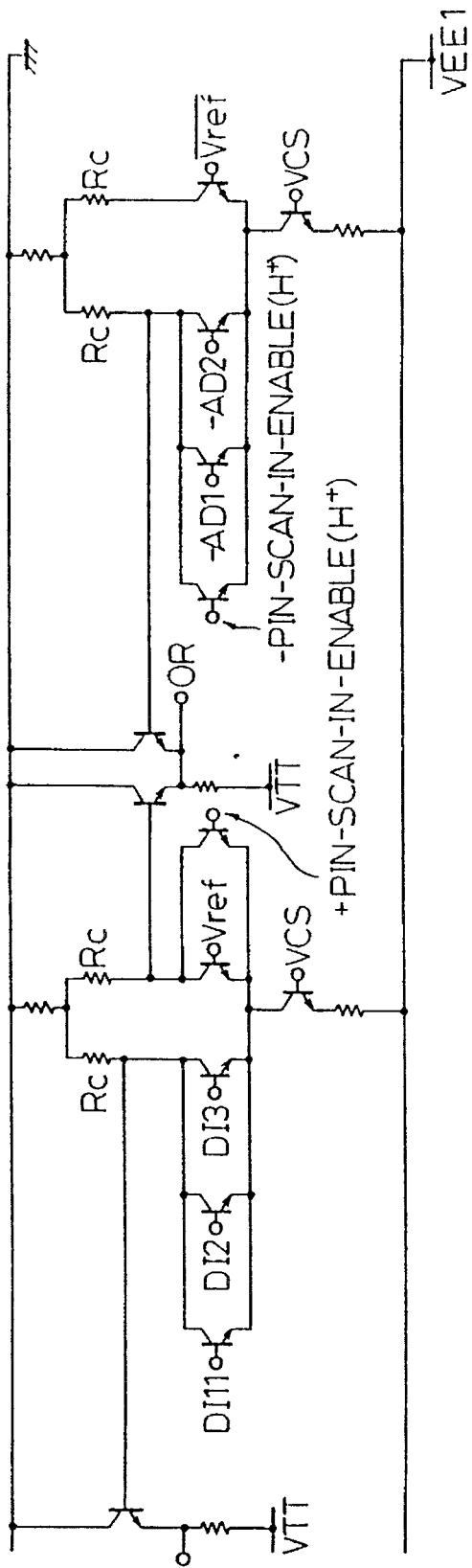

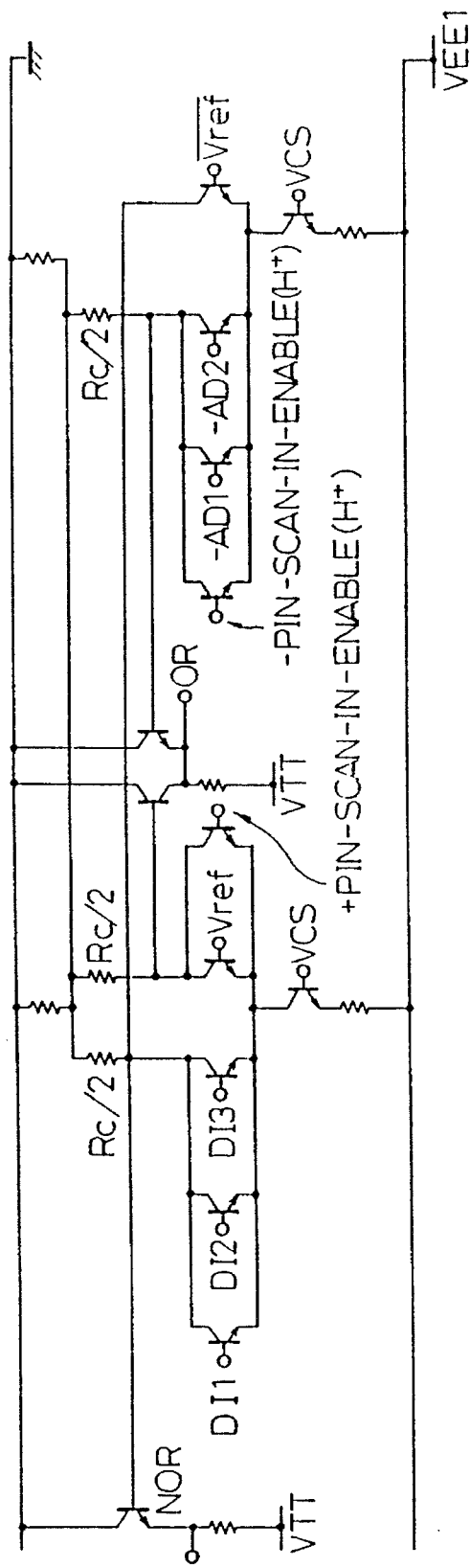

Fig.12

ORDINARY ECL LEVEL H+ ____LEVEL H+____
H————————

————— $V_{ref}$ —————

L————————

5,612,962

PIN-SCAN-IN TYPE LSI LOGIC CIRCUIT, PIN-SCAN-IN SYSTEM DRIVING CIRCUIT, AND METHOD OF TESTING CIRCUIT-MOUNTING SUBSTRATES

TECHNICAL FIELD

The present invention relates to a pin-scan-in type LSI logic circuit which facilitates testing for short-circuits or wiring breaks in a circuit-mounting substrate in computers and the like. More specifically, the invention relates to a pin-scan-in system driving circuit for driving a pin-scan-in circuit provided in an LSI logic circuit as well as to a method of testing a substrate on which the LSI logic circuit is mounted.

A computer system on a network system such as a modern large-scale on-line system or a LAN affects the users quite seriously if it breaks down. A defective mounting substrate for the computers could become the cause of a breakdown. Therefore, any defective mounting substrate for the computers must be perfectly detected prior to shipping. The present invention is to provide an LSI logic circuit which makes it possible to perfectly and easily detect any defective mounting substrate for the computers, a method of driving such a circuit, and a method of testing such a circuit.

BACKGROUND OF THE INVENTION

In a mounting substrate used in modern computers mounting a number of LSIs very densely, the wiring patterns are so fine that defects such as short-circuits among the wirings or breaking of the wires are likely to easily develop.

The wiring test for such mounting substrates has, so far, simply consisted of checking the wire connection between points such as between output pins of the individual LSIs and input pins of other LSIs connected thereto, and checking the signal levels, but did not include checking for short-circuits and defects among the wirings. This is because the signal levels are quite different depending upon the output pins of the LSIs and it is difficult to determine abnormal conditions by specifying the levels produced by the wiring short-circuits. This will be described below with reference to a concrete example shown in FIG. 13, wherein reference numeral 1 denotes circuit-mounting substrates or LSI logic circuits mounting LSIA to LSIE, and reference numerals $1_1$ to $1_6$ denote wirings.

Here, for instance, a break in the wiring $1_2$ can be detected based on the fact that the output level of the LSIB to $1_2$ is not in agreement with the input level to the LSIE or that the input level of the LSIE fails to follow a change in the output level of the LSIB. Moreover, the short-circuit between $1_4$ and $V_{EE}$ can be detected based on the fact that the level of $V_{EE}$ becomes abnormal. However, the short-circuit or the defect between $1_5$ and $1_6$ cannot be detected when the $1_5$ output level of the LSIC and the $1_6$ output level of the LSID are both "1" or "0". Therefore, the logic outputs of the LSIs for $1_5$ and $1_6$ must be made different. That is, the short circuited condition is discriminated based on an intermediate level which is created by the combination of different levels of the two wirings. When there are a large number of wirings, therefore, there exist a tremendous number of combinations of the wirings that need checking for short-circuits, and it becomes very difficult to control the logic outputs.

The object of the present invention is to provide means which facilitates the detection of short-circuits among the wirings in testing the wirings of a substrate on which are mounted LSI logic circuits.

SUMMARY OF THE INVENTION

In order to achieve the above-mentioned object, the present invention basically employs the following technical constitution. That is, a first embodiment of the present invention is concerned with a pin-scan-in type LSI logic circuit comprising a pin-scan-in control means which has a plurality of input pins and output pins for outputting logic values, which selects any one output pin and forcibly renders it to assume a level of either a logic value 1 or a logic value 0, and which forcibly renders all other remaining output pins to assume the level of the other logic value. More concretely speaking, the first embodiment is concerned with the above-mentioned pin-scan-in type LSI logic circuit which is realized by an ECL and includes a logic circuit having predetermined logic functions and an output buffer, and wherein the pin-scan-in control means inputs a pin-scan-in enable signal and an address signal, makes the output of the logic circuit having the above-mentioned predetermined logic functions effective or ineffective depending upon the value of the pin-scan-in enable signal and, at the same time, makes the detection of the value of a predetermined address signal ineffective or effective, and outputs a resultant value onto the output pin from the output buffer.

A second embodiment of the present invention is concerned with a pin-scan-in system driving circuit which includes a pin-scan-in control means provided in the aforementioned LSI logic circuit, comprising:

a pin-scan-in control means selection means which selects said pin-scan-in control means in the LSI logic circuit; and a selected condition-holding means which holds the condition selected by said pin-scan-in control means.

A third embodiment is concerned with a substrate mounting a pin-scan-in type LSI logic circuit comprising a pin-scan-in control means which has a plurality of input pins and output pins for inputting and outputting logic values, which selects any one output pin and forcibly renders it to assume a level of either a logic value 0 or a logic value 1, and which forcibly renders all other remaining output pins to assume the level of the other logic value, wherein a method of testing the circuit-mounting substrate comprises suitably selecting the output pins of said pin-scan-in type LSI logic circuit, rendering them to assume the level of one logic value, and rendering the remaining output pins to assume the level of the other logic value, and, at this time, examining the levels of the wirings connected to the output pins in order to judge the presence of short-circuits among the wirings and breaking of the wirings.

That is, the fundamental technical constitution common in the embodiments of the present invention resides in an LSI logic circuit of the pin-scan-in type mounted on a circuit-mounting substrate, wherein a particular output pin is selected and is rendered to output a logic output of "1" or "0" and all other remaining output pins are rendered to output a logic output of a value different from the logic value of the above selected particular output pin, and wherein output pins of the LSI logic circuit are suitably selected on the circuit-mounting substrate to output the above-mentioned logic output, and the signal levels are checked on the wirings connected to the output pins in order to discriminate the presence of short-circuits or breaking of wirings.

BRIEF DESCRIPTION OF DRAWINGS

FIGS. 2(a)–2(c) are a diagram illustrating the operation of the present invention;

FIGS. 3(a)–3(b) are a diagram explaining the fundamental constitution of a circuit according to an embodiment of the present invention;

FIGS. 6(a), 6(b) are a circuit diagram of an output buffer having one input of the NOR gate type according to an embodiment of the present invention;

FIGS. 7(a), 7(b) are a circuit diagram of an output buffer having two inputs of the NOR gate type according to an embodiment of the present invention;

FIGS. 8(a), 8(b) are a circuit diagram of a differential gate of the NOR gate type according to an embodiment of the present invention;

FIGS. 9(a), 9(b) are a circuit diagram of an output buffer having one input of the OR gate type according to an embodiment of the present invention;

FIGS. 11(a), 11(b) are a circuit diagram of a differential gate of the OR gate type according to an embodiment of the present invention;

FIG. 12 is a diagram of signal levels of a logic circuit according to an embodiment of the present invention;

DESCRIPTION OF PREFERRED EMBODIMENTS

Concretely described below with reference to the drawings are a pin-scan-in type LSI logic circuit according to the present invention, a method of driving a pin-scan-in system included in the LSI logic circuit, and a method of testing any circuit-mounting substrate by using the pin-scan-in type LSI logic circuit.

Figure 1:
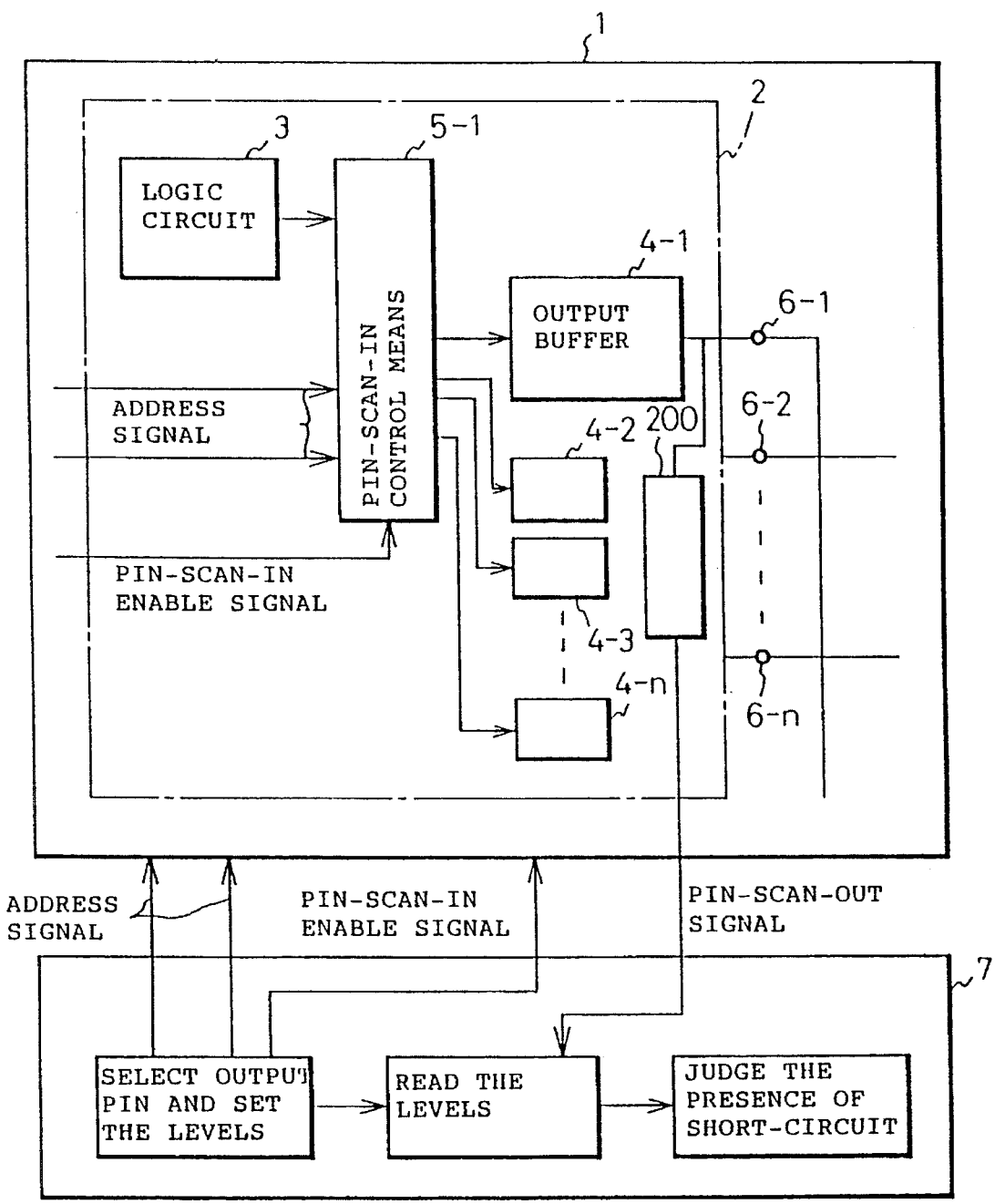
FIG. 1 is a diagram illustrating the principle of the present invention.

FIG. 1 is a diagram illustrating the principle of the pin-scan-in type LSI logic circuit according to the present invention.

In FIG. 1, reference numeral 1 denotes a circuit-mounting substrate, 2 denotes a pin-scan-in type LSI logic circuit, 3 denotes a logic circuit having a logic function which has theretofore been used, 4 denotes output buffers which buffer the output from the logic circuit 3 to stabilize the output level, to reduce the delay time of signals and to reduce signal interference from a succeeding stage to a preceding stage, and 5 denotes a pin-scan-in control means which selects the output of the logic circuit 3 and the result obtained by decoding an address signal which selects the output pin depending upon the value of a pin-scan-in control signal, and outputs it through the output buffer 4. That is, in the present invention, the logic circuit 3 is cut away from the pin-scan-in control means 5 when a +pin-scan-in enable signal is input to the pin-scan-in control means 5.

Reference numerals 6-1 to 6-n denote output pins. Here, however, the circuit elements are not shown except for the one that corresponds to the output pin 6-1.

Reference numeral 7 denotes a testing device which feeds an address signal and a pin-scan-in enable signal to the LSI logic circuits of the circuit-mounting substrate 1 that is to be tested, and reads a signal level of the output pin or of the input pin (since it is equipped with a pin-scan-out function) via a separately provided signal level judging circuit, in order to judge whether the wirings are normal or abnormal and to detect short-circuit among the wirings or defect such as breaking of wires.

FIG. 2 shows a concrete example of the LSI logic circuit of the present invention, and explains a testing method for judging breaking or short-circuit of wirings in the circuit-mounting substrate according to the present invention.

In FIG. 2, reference numerals 8, 9 and 10 denote NOR gates which, respectively, correspond to the output buffers 4 of FIG. 1. In the preceding stage thereof, therefore, there exist the pin-scan-in control means 5 and the logic circuit 3 of FIG. 1 which, however, are not shown here to simplify the description.

The NOR gates 8, 9 and 10 have affirmation output lines 11, 12, 13 and denial output lines 14, 15, 16, respectively. Detection of short-circuits among the output lines 11, 14 or the NOR gate 8, and the output lines 12, 13, 15, 16 of the NOR gates 9, 10 will now be explained.

Referring, first, to FIG. 2(a), the NOR gate 8 is address-selected to set a level H to the input thereof, and the NOR gates 9 and 10 are not selected to set a level L to the inputs thereof. As a result, the levels H and L are output to the output lines 11 to 16 as shown. A short-circuit among the wirings can be detected only at portions where the lines of the level H and the lines of the level L are intersecting each other, and can, hence, be detected at four intersecting points 17, 18, 19 and 20 marked with circles in the drawing.

Next, as shown in FIG. 2(b), the NOR gate 9 is selected to set the level H to the input thereof, and the level L is set to the other NOR gates. As a result, it becomes possible to detect the presence of short-circuit at the intersecting points 17, 19, 21 and 22 as shown. Here, the intersecting points 17 and 19 overlap those of FIG. 2(a).

Then, as shown in FIG. 2(c), the NOR gate 10 is selected to set the level H to the input thereof, and the level L is set to other NOR gates. As a result, it becomes possible to detect the presence of a short-circuit at the intersecting points 18, 20, 23 and 24. Here, the intersecting points 18 and 20 overlap those of FIG. 2(a).

As mentioned above, the testing is executed for all combinations of the pins while changing the gate selection in order to detect the presence of a short-circuit for all intersecting points.

Described below with reference to FIG. 3 is the fundamental constitution of an embodiment of a pin-scan-in type LSI logic circuit of the present invention.

FIG. 3(a) illustrates a conventional LSI logic circuit in which an output buffer 26 is connected to a NOR gate 25 having DI1, DI2 and DI3 three inputs. FIG. 3(b) shows the one in which the conventional logic circuit of FIG. 3(a) is substituted by the pin-scan-in type LSI logic circuit of the present invention, and wherein reference numerals 27, 28 and 29 denote NOR gates which constitute a pin-scan-in control means, symbol +pin-scan-in-enable denotes a pin-scan-in enable signal, symbol −pin-scan-in-enable denotes an inverted pin-scan-in enable signal, and symbols −AD1 and −AD2 denote inverted address signals.

The signals −AD1 and −AD2 are detected for their coincidence, i.e., are decoded by the NOR gate 27, and are added to one input of the NOR gate 29. The output of the NOR gate 25 which realizes its inherent logic function is added to one input of the NOR gate 28, and the outputs of the NOR gates 28 and 29 are wired OR-connected and are input to the output buffer 26. When pin-scan-pin-enable has the level H* (described later), the NOR gate 28 is made effective, and the output of the NOR gate 25 is sent to the output buffer 26 to carry out normal operation. When +pin-scan-in-enable has the level L, on the other hand, the NOR gate 29 is made effective, and the address decoding output of the NOR gate 27 is sent to the output buffer 26 to carry out the pin-scan-in operation.

FIGS. 4a–c and 5a–c illustrate another embodiment of the pin-scan-in type LSI logic circuit of the present invention.

Figure 4A:
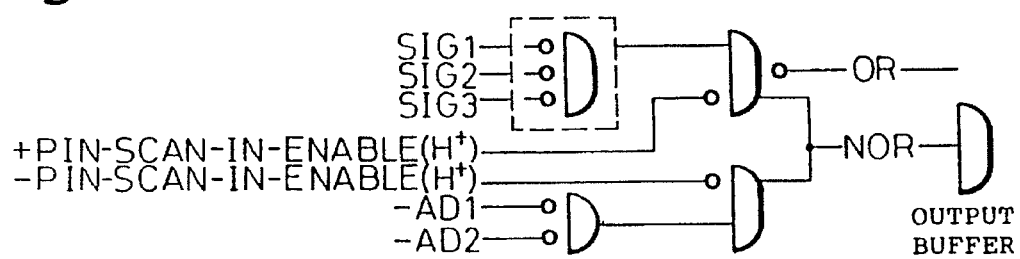
FIGS. 4(a)–4(c) are a diagram illustrating the logical constitution of the NOR gate type according to an embodiment of the present invention.
Figure 4B:
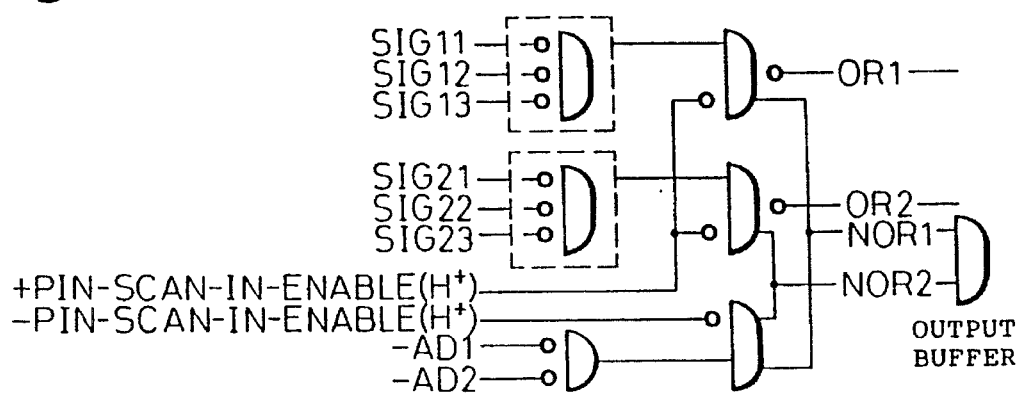
Figure 4C:
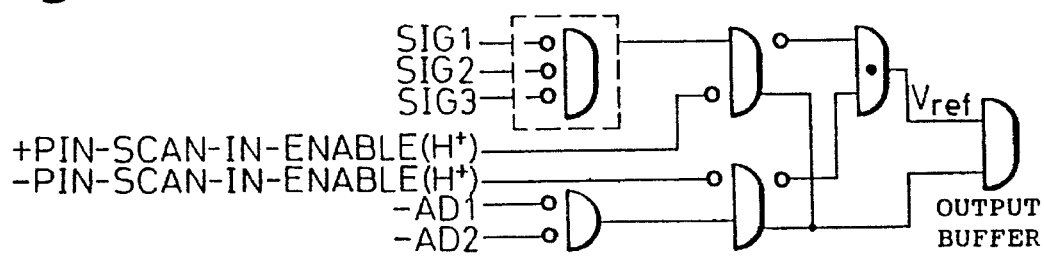

FIG. 4 illustrates a type of the NOR gate circuit, wherein FIG. 4a shows a circuit having an output buffer with one input explained with reference to FIG. 3, FIG. 4b shows a circuit having an output buffer with two inputs, and FIG. 4c shows a circuit of a differential gate structure in which the signal amplitude is halved in the preceding stage to accomplish high-speed operation. In these drawings, blocks surrounded by dotted lines represent logic circuits that have heretofore been used, and symbol SIG represents an input logic signal.

Figure 5A:
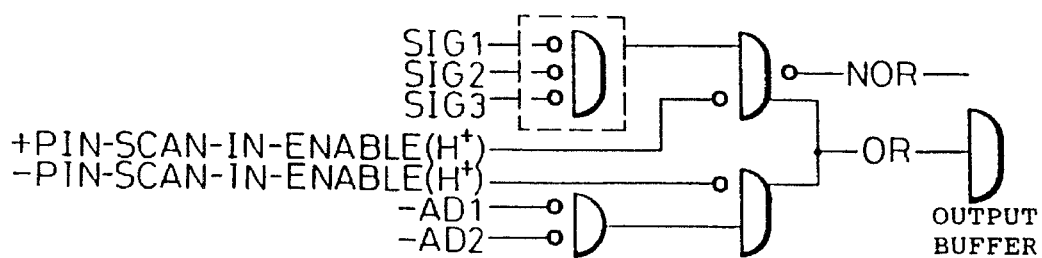
FIGS. 5(a)–5(c) are a diagram illustrating the logical constitution of the OR gate type according to an embodiment of the present invention.
Figure 5B:
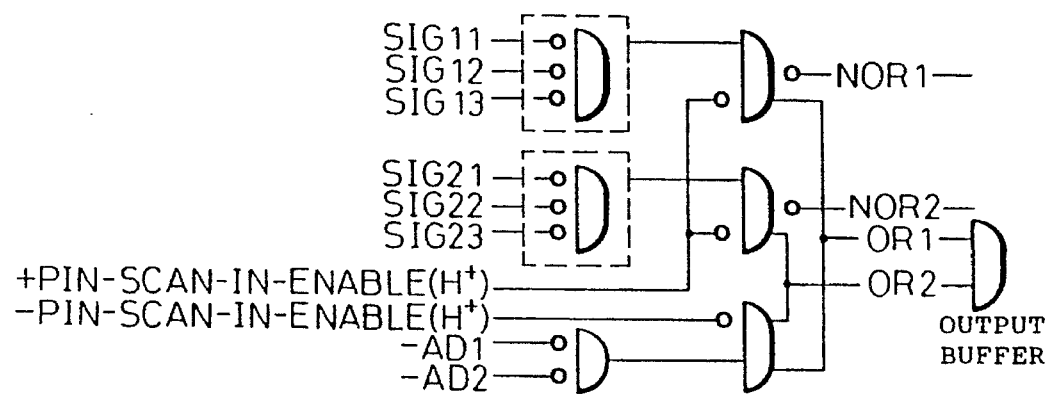
Figure 5C:
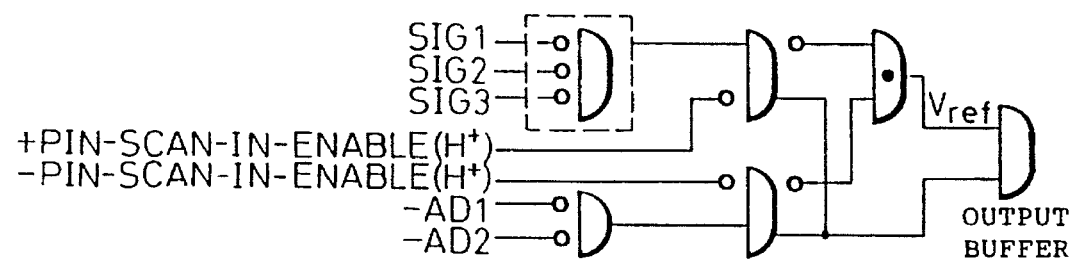

Similarly, FIG. 5 shows a type of the OR gate circuit, wherein FIGS. 5a, 5b and 5c correspond to those of the cases of FIG. 4.

FIGS. 6 to 11 illustrate constitutions of the circuits of the embodiments in which the logic circuits shown in FIGS. 4 and 5 are realized by ECL (emitter coupled logic). FIGS. 6 to 8 correspond to the circuits of FIGS. 4a, 4b and 4c, and FIGS. 9 to 11 correspond to the circuits of FIGS. 5a, 5b and 5c.

Described below are the concrete constitution and operation of the pin-scan-in control means 5 in the pin-scan-in type LSI logic circuit according to the present invention. FIG. 6(a) shows the circuit constitution of the pin-scan-in type LSI logic circuit having an output buffer of one input of the NOR gate type, and FIG. 6(b) is a truth table thereof.

In FIG. 6(a), I represents a logic circuit portion and II represents a pin-scan-in circuit portion.

The logic circuit portion I is constituted by a differential circuit which has on one side a transistor 37 that receives a reference signal and has on the other side a group of logic signal input terminals constituted by at least three transistors 34 to 36 that receive logic data DI1 to DI3, respectively, and a transistor 38 that receives a +pin-scan-in enable signal. Here, the collectors of a group of transistors constituting the above group of logic signal input terminals are connected to a transistor 43 which constitutes a NOR output buffer 32, and the collector of the transistor 37 which inputs the reference signals is connected to the buffer 33 thereby to constitute the NOR gate 30.

The pin-scan-in circuit portion II is constituted by a differential circuit which has on one side a transistor 42 that inputs the reference signal and has on the other side a group of address signal input terminals constituted by at least two transistors 40 and 41 that receive address data AD1 and AD2, respectively, and a transistor 39 which receives a −pin-scan-in enable signal, and wherein the collectors of a group of transistors constituting the above group of address signal input terminals are connected to a transistor 44 that constitutes the NOR output buffer 32.

Figure 12:
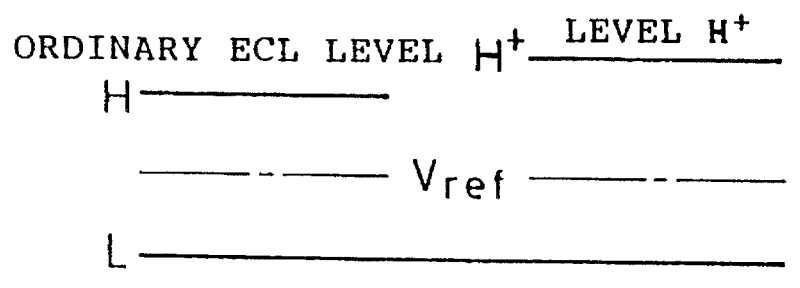

In the diagramed ECL circuits, the two control signals, i.e., the +pin-scan-in enable and −pin-scan-in enable signals have the level H (represented by H$^+$) which is higher than an ordinary ECL level as shown in FIG. 12. The level H$^+$ is formed by omitting a level-shifting resistor which is inserted in common between the power source and the collectors of the two transistors in order to decrease the amplitude in the ECL. In the present invention, when a signal of the level H$^+$ is input to the ECL, the state of the ECL is predominantly determined by H$^+$ only, and the input signal to the same ECL is not affected by the operation. When an input/output buffer of the OR gate type is used, in particular, the input of a signal of the ordinary level H may result in an incorrect judgement. Therefore, H$^+$ is added in order to prevent incorrect judgement.

Described below is the circuit of an embodiment having an output buffer of one input of the NOR gate type shown in FIG. 6(a). In FIG. 6(a), the −pin-scan-in enable signal has the level H$^+$ when the +pin-scan-in enable signal has the level L, and wherein the ECL NOR gate 30 exhibits the NOR logic of inputs DI1, DI2 and DI3. In the ECL NOR gate 31, however, the transistor 39 is rendered conductive in a fixed manner, and the action of the inputs −AD1 and −AD2 to the transistors 40 and 41 become ineffective.

Therefore, the NOR output of DI1, DI2 and DI3 is obtained via the transistor 43 of buffer 32 in the drawing. When the +pin-scan-in enable signal has the level H$^+$, on the other hand, the −pin-scan-in enable signal has the level L, and the transistor 38 in the ECL NOR gate 30 is rendered conductive in a fixed manner. Therefore, the NOR function of the ECL NOR gate 30 becomes ineffective. Then, since the transistor 39 in the ECL NOR gate 31 is rendered non-conductive in a fixed manner, the NOR logic of address inputs −AD1 and −AD2 only become effective, and a NOR output is obtained from the transistor 44 of the buffer 32. The truth table of FIG. 6(b) shows the control conditions of logic operations, and wherein X represents a given condition or ineffectiveness.

Figures 10A, 10B:
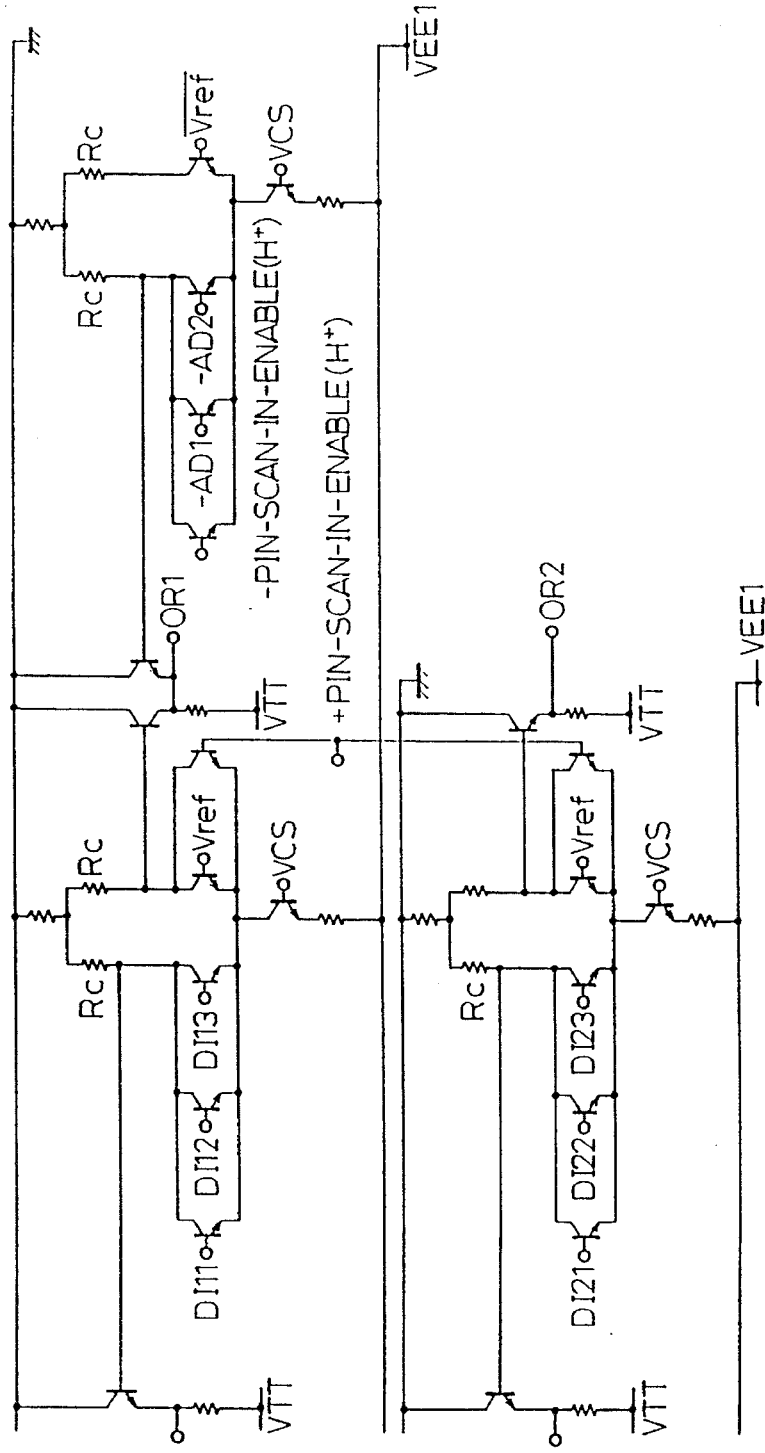
FIGS. 10(a), 10(b) are a circuit diagram of an output buffer having two inputs of the OR gate type according to an embodiment of the present invention.
Figure 13:
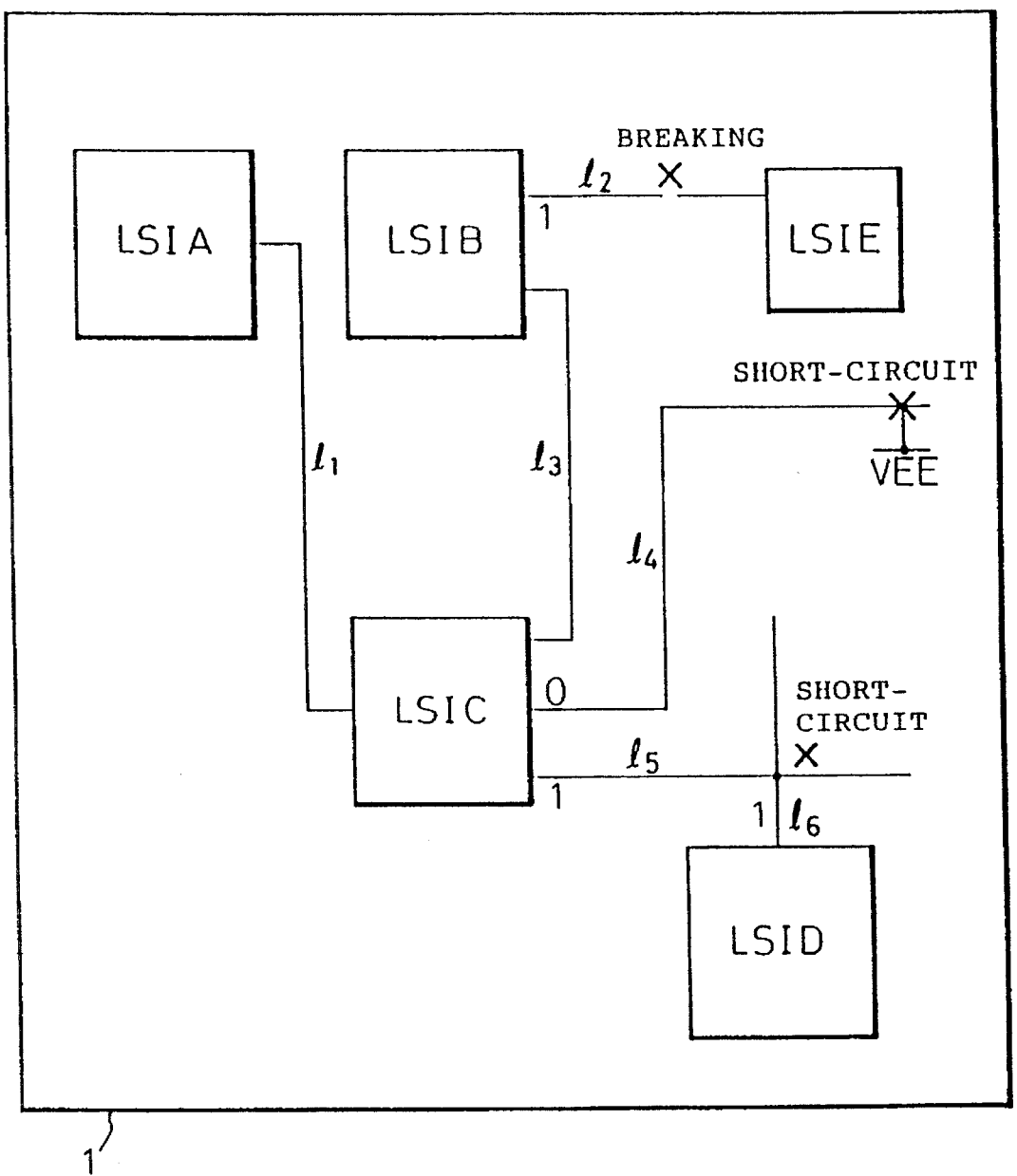
FIG. 13 is a diagram explaining a conventional method of testing the circuit-mounting substrates.

FIGS. 7 to 11 illustrate other concrete examples of the pin-scan-in circuit used in the present invention, and wherein FIG. 7 shows an embodiment of an output buffer having two inputs of the NOR gate type, FIG. 8 shows an embodiment of a differential gate of the NOR gate type, FIG. 9 shows an embodiment of an output buffer having one input of the OR gate type, FIG. 10 shows an embodiment of an output buffer having two inputs of the OR gate type, and FIG. 11 shows a differential gate of the OR gate type. In all of these cases, the pin-scan-in enable signal in the pin-scan-in control means 5 operates in fundamentally the same manner as that of the aforementioned concrete examples, and the control conditions of the logic operations are as shown in the truth table.

According to the present invention which makes use of an LSI logic circuit of the pin-scan-in type, the level of any one output pin can be easily made different from the levels of all other output pins, and the presence of a short-circuit among the wirings connected to a number of output pins can be detected systematically and easily, making it possible to increase precision for testing the mounting substrates used for the computers and to markedly improve reliability.

Next, described below are a method of driving the pin-scan-in system which is constituted by including the pin-scan-in control means 5 according to a second embodiment of the present invention, and a circuit constitution thereof.

Figure 15:
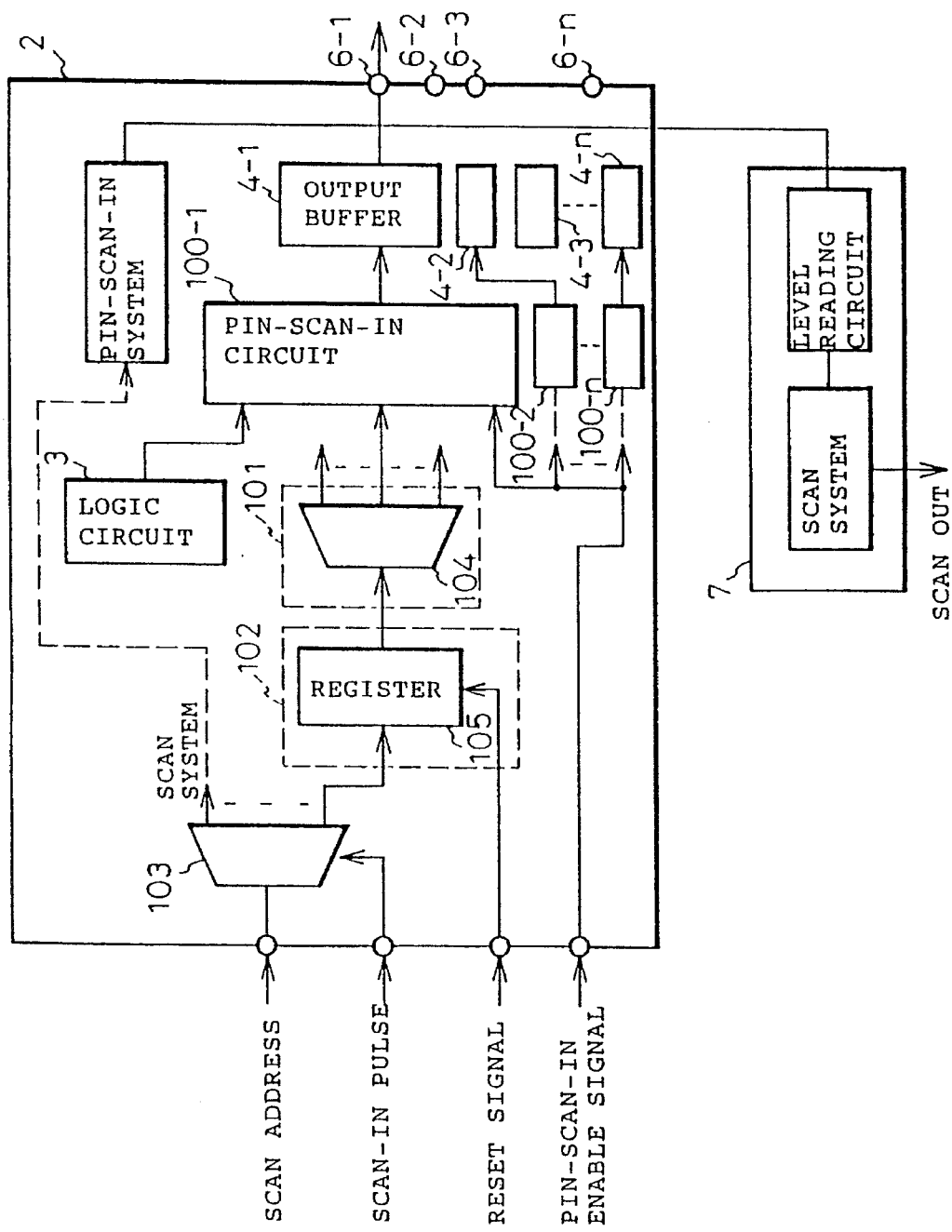
FIG. 15 is a block diagram which illustrates a concrete example of FIG. 14.

In the aforementioned pin-scan-in control means 5 in the pin-scan-in type LSI logic circuit, as shown in FIG. 15, pin-scan-in circuits 100-1, 100-2, ---, 100-n are provided for the output buffers 4-1, 4-2, ---, 4-n that are provided to correspond to the output pins 6-1, 6-2, ---, 6-n. In the pin-scan-in control means 5, it is necessary to select a pin that is to be measured and to control it.

In the aforementioned pin-scan-in system, the pin-scan-in control means 5 did not select or drive the pin-scan-in circuit.

This embodiment provides a pin-scan-in control means which drives the pin-scan-in circuit 100 using a circuit having a reduced number of gates.

Figure 14:
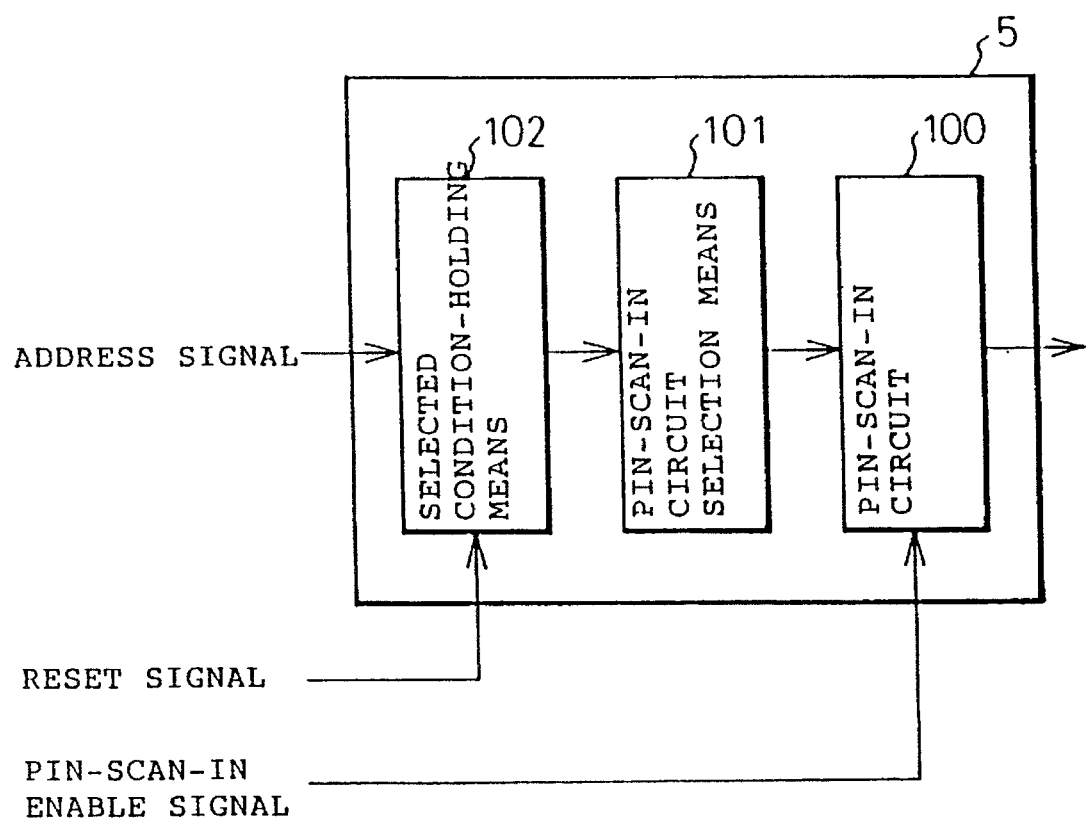
FIG. 14 is a diagram explaining the principle for driving a pin-scan-in system according to the present invention.

FIG. 14 is a diagram illustrating the principle of this embodiment.

FIG. 14 is a diagram showing a pin-scan-in system driving circuit which selectively drives the pin-scan-in circuit 100 in the pin-scan-in control means 5 provided in the LSI logic circuit, and wherein the pin-scan-in control means comprises a pin-scan-in circuit selection means 101 which selects the pin-scan-in circuit 100 and a selected condition-holding means 102 which holds the condition selected by the pin-scan-in circuit selection means 101.

The selected condition-holding means 102 of this embodiment holds an address signal that is input thereto and that selects the pin-scan-in circuit 100.

The pin-scan-in circuit selection means 101 selects out of a plurality of pin-scan-in circuits the pin-scan-in circuit 100 which corresponds to an address signal that is input to and held by the selected condition-holding means 102.

When an enable signal is input to the pin-scan-in circuit 100, only the pin-scan-in circuit that is selected by the pin-scan-in selection means 101 is driven to change the level of the corresponding output pin.

As described above, the address signal that selects the pin-scan-in circuit is held and the pin-scan-in circuit that corresponds to the thus held address signal is selected. Therefore, the pin-scan-in circuit can be driven using a circuit having a reduced number of gates.

FIG. 15 is a diagram illustrating the constitution of this embodiment.

In FIG. 15, the pin-scan-in circuit 100, pin-scan-in circuit selection means 101 and the selected condition-holding means 102 are as described with reference to FIG. 14, and the LSI logic circuit 2, logic circuit 3 and the output buffer 4 are as described with reference to FIG. 1.

In this embodiment, the selected condition-holding means 102 is constituted by a register 105, and the pin-scan-in selection means 101 is constituted by a decoder 104. Further, the pin-scan-in circuit 100 is constituted by NOR gates 27, 28 and 29 as explained with reference to FIG. 3.

Reference numeral 103 denotes a decoder of the scan system which is provided for testing the logic operation of the LSI logic circuit 2. The scan address signals that are input are classified and selected by the decoder, and the address signal related to the pin-scan-in operation is output to the register 105. Thus, sharing the decoder of the scan type makes it possible to decrease the number of input pins.

FIG. 15 shows only one output buffer 4. In practice, however, the LSI logic circuit has a plurality of output pins, and output buffers are provided to correspond to these pins. Moreover, the pin-scan-in circuits 100 are provided to correspond to the output buffers.

The address signal is held in the register 105 until a reset signal is input thereto.

That is, in the above-mentioned pin-scan-in control circuit of the present invention, when the pin-scan-in enable signal is input to select the address signal, the output of the selected output pin assumes 1 or 0, and the output of the output pin for which the address signal is not selected assumes 0 or 1 opposite to the selected output pin.

That is, since this embodiment does not use the flip-flop, there is no means for storing the selected condition. In an ordinary binary scan circuit, the latch circuit is provided for every output buffer to store the selected condition. In such a constitution in which the latch circuit is provided for each of the buffers, however, the number of flip-flops increases. Therefore, this embodiment employs a constitution which has no latch circuit in order to simplify the circuit constitution.

For this reason, therefore, the embodiment of the present invention is provided with the selected condition-holding means 102 which holds the address signal.

There is no particular limitation on the scan system, and any known scan system such as an address scan, a serial scan or the like scan of the type which produces an output on a scan out that corresponds to a scan address that is input, can be used.

The pin-scan-in system and the scan system must be provided separately from each other. That is, when a circuit is to be tested, there may be employed a system in which a signal "1" or "0" is produced on the output pin by the pin-scan-in circuit and the output of the pin is read out by the pin-scan-out. In this case, however, the output "1" or "0" of the particular pin must have been fixed.

On the other hand, the pin-scan-out is included in the address scan system, and both the pin-scan-in system and the address scan system are generated by the same address. Therefore, when access is to be made next to the output pin that is once specified by the address signal, the address signal is no longer under the selected condition; i.e., it becomes necessary to fix the address during the period of reading by the pin-scan-out. For this reason, provision is made of a register 102 which selects and holds the address signal.

It is therefore made possible to detect the output condition of the same output pin by scanning the address scan system while fixing the condition of the output pin by the register.

Concretely speaking with reference to FIG. 15, the selected condition-holding means 102 which is the register is reset, a scan address is input via the decoder 103, and the output of a desired output pin is set to be, for example, "1" and is fixed in this condition. Then, the scan address is scanned to read the above desired output pin via the pin-scan-out circuit 200 and to measure it.

The above-mentioned embodiment can be modified in a variety of other ways in accordance with the gist of the present invention.

According to the aforementioned embodiment, the following effects are obtained.

(1) An address signal is held that selects the pin-scan-in circuit, and the pin-scan-in circuit is selected that corresponds to the address signal that is held. Therefore, the pin-scan-in circuit can be driven by a circuit having a reduced number of gates.

(2) The address signal for selecting the pin-scan-in circuit is input using the address signal input pin of the scan system which tests the logic operation of the LSI logic circuit. Therefore, the number of pins can be reduced.

The pin-scan-in control means 5 of the present invention is provided with a plurality of output buffers 4-1 to 4-n that correspond to a plurality of output pins 6-1 to 6-n and with a plurality of pin-scan-in circuits 100-1 to 100-n corresponding thereto, and a desired circuit is selected out of the plurality of pin-scan-in circuits based on a data temporarily stored in the selected condition-holding means 102 constituted by the register via the pin-scan-in circuit selection means 101 constituted by the decoder.

In the present invention, furthermore, it is desired that the pin-scan-in circuits constituting the pin-scan-in control means 5 are each constituted by two decoders and are selected by two address signals –AD1 and –AD2.

The above-mentioned constitution makes it possible to greatly decrease the number of gates of the pin-scan-in control means 5.

When the circuit-mounting substrate is to be tested for its short-circuit or breaking of wirings by using the pin-scan-in type LSI logic circuit of the present invention, any two output pins are selected out of many output pins 6-1 to 6-n in the case of testing the short-circuit of wirings, and the output states of the thus selected output pins are measured. When, for example, two particular wirings are short-circuited in the ECL circuit, there exists a dot OR relationship of the level "H" if the output of one of the wirings has the level "H" even though the output of the other wiring has the level "L". That is, if the output states of the two wirings have been known, i.e., one having the level "H" and the other having the level "L", but if the measured results are the level "H" for the two outputs, then it is judged that the two wirings are short-circuited. In the case of a broken (open) condition, two particular wirings are selected by the same method, and measurement is taken by alternatingly setting the output state to the level "H" and the level "L" to render the judgement.

What is claimed:

1. A pin-scan-in type LSI logic circuit comprising a pin-scan-in control means including:

a plurality of input terminals;

a plurality of output pins for outputting logic values;

a first NOR gate provided for each of said plurality of output pins, for decoding an address signal of a plurality of bits received at predetermined terminals of said plurality of input terminals; and a second NOR gate responsive to an output of said first NOR gate and a pin-scan-in enable signal received at one input terminal other than said predetermined terminals, and outputting a signal of either a logic value 1 or a logic value 0 to a corresponding output pin, said pin-scan-in control means selecting one of said plurality of output pins and causing the selected one to assume a level of one logic value, and causing all other output pins to assume a level of the other logic value.

2. A pin-scan-in type LSI logic circuit according to claim 1, wherein said pin-scan-in type LSI logic circuit uses emitter coupled logic and includes a logic circuit having predetermined logic functions and an output buffer, the pin-scan-in control means inputting a pin-scan-in enable signal and an address signal, makes the output of the logic circuit having said predetermined logic functions effective or ineffective depending upon the value of the pin-scan-in enable signal and, at the same time, makes the detection of the value of a predetermined address signal ineffective or effective, and outputs a resultant value onto the output pin from the output buffer.

3. A pin-scan-in system driving circuit including a pin-scan-in circuit that is provided in the LSI logic circuit of claim 1, wherein said LSI logic circuit includes:

pin-scan-in circuit selection means for selecting said pin-scan-in circuit; and selected condition-holding means for holding the condition selected by said pin-scan-in circuit selection means.

4. A pin-scan-in system driving circuit according to claim 3, wherein an address signal with which said pin-scan-in control means selection means selects the pin-scan-in control means is input through an address signal input pin of the scan system that is used for testing the logic operation of the LSI logic circuit.

5. A method of testing a circuit mounting substrate mounting a pin-scan-in type LSI logic circuit having a pin-scan-in control means including:

a plurality of input terminals; a plurality of output pins for outputting logic values; a first NOR gate provided for each of said plurality of output pins, for decoding an address signal of a plurality of bits received at predetermined terminals of said plurality of input terminals; and a second NOR gate responsive to an output of said first NOR gate and a pin-scan-in enable signal received at one input terminal other than said predetermined terminals, and outputting a signal of either a logic value 1 or a logic value 0 to a corresponding output pin, comprising the steps of:

selecting output pins of said pin-scan-in type LSI logic circuit;

causing said selected pins to assume a level of one logic value;

causing the remaining output pins to assume a level of said other logic value; and examining the levels of wirings connected to the output pins to judge the presence of one of a short-circuit among the wirings and a breaking of the wirings.

\* \* \* \* \*